(12) United States Patent
Cieslinski

(10) Patent No.: US 8,248,501 B2
(45) Date of Patent: Aug. 21, 2012

(54) IMAGE SENSOR CAPABLE OF REDUCING THE VISIBILITY OF THE BORDER WHICH SEPARATES COLUMN PIXEL GROUPS

(75) Inventor: Michael Cieslinski, Ottobrunn (DE)

(73) Assignee: Arnold & Richter Cine Technik GmbH & Co. Betriebs KG, Munich (DE)

( * ) Notice: Subject to any disclaimer, the term of this patent is extended or adjusted under 35 U.S.C. 154(b) by 272 days.

(21) Appl. No.: 12/603,881

(22) Filed: Oct. 22, 2009

(65) Prior Publication Data

US 2010/0110251 A1   May 6, 2010

(30) Foreign Application Priority Data

Oct. 23, 2008   (DE) .......................... 10 2008 052 916

(51) Int. Cl.
*H04N 5/335*   (2011.01)
(52) U.S. Cl. ...................................................... 348/302
(58) Field of Classification Search ........................ None
See application file for complete search history.

(56) References Cited

U.S. PATENT DOCUMENTS

| | | | |
|---|---|---|---|
| 4,996,413 A * | 2/1991 | McDaniel et al. ......... | 250/208.1 |
| 5,896,172 A | 4/1999 | Korthout et al. | |
| 6,618,155 B2 * | 9/2003 | Metcalfe et al. ............ | 356/625 |
| 6,822,213 B2 * | 11/2004 | Stark ......................... | 250/208.1 |
| 6,838,651 B1 * | 1/2005 | Mann ......................... | 250/208.1 |
| 7,880,786 B2 * | 2/2011 | Muramatsu ................ | 348/302 |
| 7,907,190 B2 * | 3/2011 | Kosover et al. ............. | 348/241 |

FOREIGN PATENT DOCUMENTS

EP    1 389 740 A1   2/2004

OTHER PUBLICATIONS

German Search Report dated Aug. 4, 2009, DE 10 2008 052 916.8.

* cited by examiner

*Primary Examiner* — Luong T Nguyen
(74) *Attorney, Agent, or Firm* — Gifford, Krass, Sprinkle, Anderson & Citkowski, P.C.

(57) ABSTRACT

The invention relates to an image sensor, in particular to a CMOS image sensor, for electronic cameras, having a plurality of light-sensitive pixels arranged in rows and columns, wherein the pixels of a respective column are divided into a first pixel group and a second pixel group, wherein, in each column, the pixels of the respective first pixel group are coupled to a common first column amplifier via a common first column line and the pixels of the respective pixel group are coupled to a common second column amplifier via a common second column line. The division of the pixels into the first pixel group and second pixel group is different for different columns.

11 Claims, 4 Drawing Sheets

IMAGE SENSOR CAPABLE OF REDUCING THE VISIBILITY OF THE BORDER WHICH SEPARATES COLUMN PIXEL GROUPS

CROSS-REFERENCE TO RELATED APPLICATION

This application claims priority of German Patent Application No. 10 2008 052 916.8 filed Oct. 23, 2008, which is incorporated herein by reference.

FIELD OF THE INVENTION

The present invention relates to an image sensor, in particular to a CMOS image sensor, for electronic cameras, having a plurality of light-sensitive pixels arranged in rows and columns.

BACKGROUND OF THE INVENTION

Known electronic cameras include an image sensor which comprises a plurality of light-sensitive elements—so-called pixels—which are arranged in rows and columns and which convert light incident through an objective of the camera into electrical signals. Each of the pixels is addressed to read out an image, with each pixel corresponding to a respective picture element of the image. A signal which is proportional to a charge of the pixel collected by an exposure is conducted to an output of the image sensor.

Sensors are in particular known which have a separate row selection line for each row and a separate column line for each column. Such an image sensor is shown in FIG. 1. The reading out of the image sensor 1 shown in FIG. 1 takes place row-wise, i.e. row for row. For this purpose the pixels 2 of the respective row is connected to the column lines 5 by means of the respective row selection line 6. A separate column amplifier 4 is associated with each of the column lines 5 to amplify the signals of the pixels 2 of the selected row applied to the column lines 5. In FIG. 1, the column amplifiers 4 are not shown individually, but rather in the form of a coherent block which symbolizes the column amplifiers 4 arranged in a row. The amplified signals are then conducted via a multiplexer device to the output or, if a plurality of outputs are provided, as is preferred to achieve a high picture rate, to the outputs of the image sensor. Furthermore, a row addressing logic 3 can be recognized to address the row selection line 6 associated with the respective row to be read out.

The speed at which an image can be read out of the image sensor in accordance with FIG. 1 is determined inter alia by that time which the signal of a pixel needs to move from the output of the pixel along the respective column line to the respective column amplifier.

With image sensors having a large image format of for example, 20 mm image height, the column lines of the image sensor are approximately 20 mm long and have a capacity of, for example, 10 pF. The pixels are typically only a few µm large. There is therefore only a little space available for each pixel. Since the light-sensitive element of a pixel should be as large as possible to achieve a high light sensitivity, the other elements of a pixel have to be made all the smaller, i.e. small transistors have to be used. Such transistors need, for example, 2 µs to drive the capacity of a column line. With correlated double sampling, two reading processes take place per picture element to be read out since a reference signal is additionally read out beside the actual signal for the suppression of the thermal noise. The reading of the signal values of a row then takes 5 µs, for example. The reading of an image with, for example, 200 lines thus requires a total of 10 ms so that the picture rate is limited to 100 frames per second.

To achieve a higher picture rate, it is known to divide the column lines in the middle as is shown in the image sensor 1 in accordance with FIG. 2. The pixels 2 of a respective column are therefore divided into a first pixel group, a lower pixel group in FIG. 2, and into a second pixel group, an upper pixel group in FIG. 2, with the pixels 2 of the respective first pixel group in each column being coupled to a common first column amplifier 41 via a common first column line 51 and the pixels 2 of the respective second pixel group being coupled to a common second column amplifier 42 via a common second column line 52. Since the column lines 51, 52 of the image sensor 1 in accordance with FIG. 2 are only half as long as the column lines 5 of the image sensor 1 in accordance with FIG. 1, they also only have approximately half the capacity of the column lines 5 of the image sensor 1 in accordance with FIG. 1. In addition, two respective rows, namely a row from the lower image field half and a row from the upper image field half, can be read out simultaneously. The possible picture rate can thereby increase to, for example, 300 frames per second.

The signals of the pixels 2 of the image sensor 1 in accordance with FIG. 2 are therefore read out over two rows of column amplifiers 41, 42 which are arranged at the lower edge and at the upper edge of the image field of FIG. 2. The image to be read out and the pixel field are thereby split into two blocks 10, 11 such that the pixels 2 of the lower block 10 are associated with the lower row of column amplifiers 41 and the pixels 2 of the upper block 11 are associated with the upper row of column amplifiers 42. The separation of the two blocks 10, 11 is illustrated by a dividing line 7.

As a rule, the individual column amplifiers cannot be manufactured completely identically with one another. It is rather the case that the properties of the column amplifiers vary slightly from one another. For example, an offset voltage, an amplification or a drift can be slightly different for different column amplifiers. The picture elements associated with the respectively deviating column amplifier then appear somewhat brighter or darker in comparison with the other picture elements. These slight deviations are as a rule not perceived by the eye, however, if such slight deviations occur distributed statistically or randomly over the whole image.

If, however, the mean value of the deviation over the upper column amplifier row deviates systematically from the mean value of the deviation over the lower column amplifier row, for example due to a deviation of one or more process parameters in the manufacture of the column amplifiers, the border formed between the two blocks can be perceived as interference which is horizontal in FIG. 2 and runs through the image center, in particular because the human eye amplifies linear structures.

SUMMARY OF THE INVENTION

It is the underlying object of the invention to provide an image sensor of the initially named kind with split column lines which makes it possible to suppress or at least reduce the visibility of the border between such blocks.

The object is satisfied by an image sensor having the features of claim 1 and in particular in that the division of the pixels into the first pixel group and the second pixel group is different for different columns.

In the image sensor in accordance with the invention, the border between the pixels of the first pixel group and the pixels of the second pixel group extends along different rows with respect to different columns. In other words, the number of the pixels in the first pixel group and the number of pixels in the second pixel group vary between the columns.

The border between the pixels of the first pixel groups of the columns and the pixels of the second pixel groups of the columns which in particular extends over the total width of the image field is therefore no longer formed as a straight line which is particularly easy to perceive with the eye. The visibility of the aforesaid interference can hereby be suppressed, but at least reduced.

To obtain a color image sensor, it is customary to provide the pixels with color filters which are arranged, for example, in accordance with the known Bayer pattern. In the Bayer pattern, the color filters are arranged in the sequence red-green in odd rows and in the sequence green-blue in even rows. However, other color filter masks than a Bayer pattern can also generally be used. It is in particular of advantage for color image sensors if the columns are divided into groups of a plurality of adjacent columns, with the division of the pixels into the first pixel group and into the second pixel group being identical within a respective column group. Errors in the color interpolation can hereby be avoided. In the case of the named Bayer pattern, the columns are preferably divided into groups of precisely two adjacent columns.

The division of the pixels into the first pixel group and the second pixel group can alternate between the columns or between the aforesaid groups of adjacent columns. In other words, the border running between the pixels of the first pixel group and the pixels of the second group varies alternately between precisely two different curves. The division with respectively next-but-on adjacent columns of column groups is then identical. Ultimately, therefore, a first division pattern and a second division pattern arise which alternate with respect to one another.

The division of the pixels into the first pixel group and the second pixel group can alternatively vary between the columns or between the aforesaid groups of adjacent columns in a quasi-random manner. The term "quasi-random variation" is to be understood such that the variation of the division does not have any regular and/or repeating structure. The visibility of the border between the blocks can hereby be further reduced.

Those rows which include at least one pixel from one of the first pixel groups and at least one pixel from one of the second pixel groups can form an overlap region of the image sensor. The overlap region is in particular arranged in a middle region of the image sensor with respect to the column direction.

The image sensor is preferably made to read out in parallel—i.e. simultaneously pair-wise—those rows which are arranged outside the overlap region and only include pixels of the first pixel groups and those lines which are arranged outside the overlap region and only include pixels of the second pixel groups. This is in particular possible since two column amplifier rows separated from one another are provided for the rows to be read out in parallel. The picture rate can hereby be increased.

Those rows which are arranged within the overlap region are preferably read out sequentially—i.e. after one another—in particular to avoid a plurality of pixels, in particular precisely two pixels, from the same pixel group of a column being connected simultaneously to the common column amplifier.

An advantageous further development of the invention relates to the problem that the aforesaid overlap region can be made up of alternatingly light and dark strips. This can be the case when there is a systematic error between the first column amplifier row and the second column amplifier row, such as is also explained above in connection with the disadvantage of the known image sensor in accordance with FIG. 2. If such an error relates to the level of the amplified signal and thus to the brightness of a picture element, the pixels of the first pixel groups of the columns in the image thus appear either lighter or darker than the pixels of the second pixel groups of the columns, whereby a stripe pattern arises in the named overlap region. Such a stripe pattern as a rule has a very low spatial frequency so that the stripe pattern cannot necessarily be perceived with the eye.

To preclude the occurrence of such a stripe pattern from the very beginning, the image sensor in accordance with a further development is adapted to modify the amplified signals of at least some (preferably all) of the pixels of the first pixel groups arranged within the overlap region in dependence on the amplified signals of at least some (preferably all) of the pixels of the second pixel groups arranged within the overlap region, and to modify the amplified signals of at least some (preferably all) of the pixels of the second pixel groups arranged within the overlap region in dependence on the amplified signals of at least some (preferably all) of the pixels of the first pixel groups arranged within the overlap region, in order to carry out a mutual brightness compensation.

For example, the mean value of the amplified signals of the pixels of the first pixel groups can be calculated from the overlap region and the mean value of the amplified signals of the pixels of the second pixel groups is calculated from the overlap region and half the difference of these two mean values are added to the signals of the pixels of the "darker" pixel groups or are subtracted from the signals of the pixels of the "brighter" pixel groups. The overlap region thus appears in a mean brightness. A jump therefore arises in each case at the upper and lower margins of the overlap region which corresponds to half the difference of the mean values. These two leaps are, however, frequently so small that they can no longer be perceived with the eye. To reduce these brightness jumps even further, provision can also be made that the brightness compensation varies within the overlap region toward the edges of the overlap region.

Preferably not only the amplified signals of the pixels arranged within the overlap region are compensated with respect to their brightness, but additionally also the amplified signals of the pixels of those rows which are arranged outside the overlap region and which are located in a respective border region to the two margins of the overlap region. In other words, a brightness compensation is also carried out with respect to the amplified signals of the pixels of one or more rows adjacent to the overlap region. The region in which the brightness compensation is carried out is hereby enlarged (with respect to the explained overlap region). In this respect, it is further preferred if the brightness compensation is reduced as the spacing from the margins increase. The respective brightness jump can hereby be changed into a flowing brightness transition. In an exceptional case, the named respective border region can extend over all rows which are arranged outside the overlap region and only include pixels of the first pixel groups or only pixels of the second pixel groups. In this further development, it is possible that only the explained mean values of the amplified signals of the pixels within the overlap region are taken into account as the basis for the brightness compensation of the signals of pixels outside the overlap region.

Advantageous embodiments of the invention are also set forth in the dependent claims, in the description and in the drawing.

BRIEF DESCRIPTION OF THE DRAWINGS

The invention will be described in the following by way of example with reference to the drawing. There are shown, schematically in each case.

DETAILED DESCRIPTION OF THE INVENTION

Figure 3:
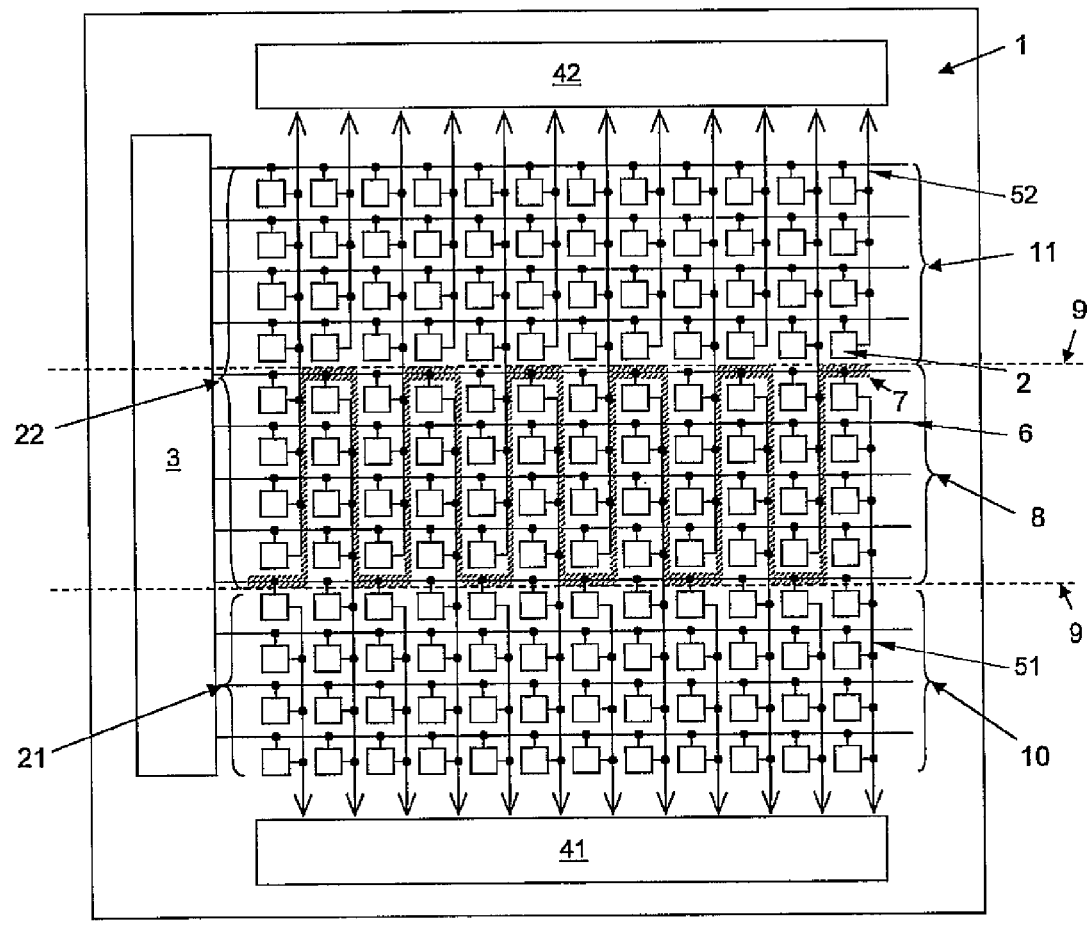
FIG. 3 an image sensor in accordance with the invention in accordance with a first embodiment.

The CMOS image sensor 1 shown in FIG. 3 has a plurality of light-sensitive pixels 2 which are arranged in rows (shown horizontally here) and columns (shown vertically here). Each row has a row selection line 6 for the pixels 2 associated with the respective row. The image sensor 1 furthermore includes a row address logic 3 by which a respective one of the rows 6 can be selected for the reading out of the signals of the pixels 2 of this row 6.

The pixels of each column are in this respect divided into a lower pixel group 21 and an upper pixel group 22, with the division only being illustrated with reference numerals with reference to the column located at the left hand margin of the pixel field for reasons of simplicity in FIG. 3. The lower pixel group 21 of this singled out column includes four pixels 2; the upper pixel group 22 of this column includes eight pixels 2. The topmost pixel 2 of the respective lower pixel group 21 and the bottommost pixel 2 of the respective upper pixel group 22 are adjacent to one another.

The pixels 2 of the first pixel group 21 of each column are coupled to a common lower column amplifier 41 via a common lower column line 51 and the pixels 2 of the upper pixel group 22 of each column are coupled to a common upper column amplifier 42 via a common upper column line 52. The lower column amplifiers 41 arranged along a row are, however, not shown individually for reasons of simplicity in FIG. 3, but rather schematized as a column amplifier row 41. The same applies accordingly to the upper column amplifier 42.

The division of the pixels 2 into the first pixel group 21 and the second pixel group 22 alternates between the columns, i.e. the division is identical in respectively next-but-one adjacent columns. An overlap region 8 is hereby created which includes those rows which include both pixels 2 from the lower pixel groups 21 and pixels 2 from the upper pixel groups 22. The overlap region 8 is arranged in a middle region of the image sensor 1 with respect to the column direction shown vertically here, and indeed between those lower rows which only include pixels 2 of the lower pixel groups 21 and define a lower block 10 and those upper rows which only include pixels 2 of the upper pixel groups 22 and define an upper block 11. In the overlap region 8, the lower pixel groups 21 and the upper pixel groups 22 engage into one another like pixels.

Figure 1:
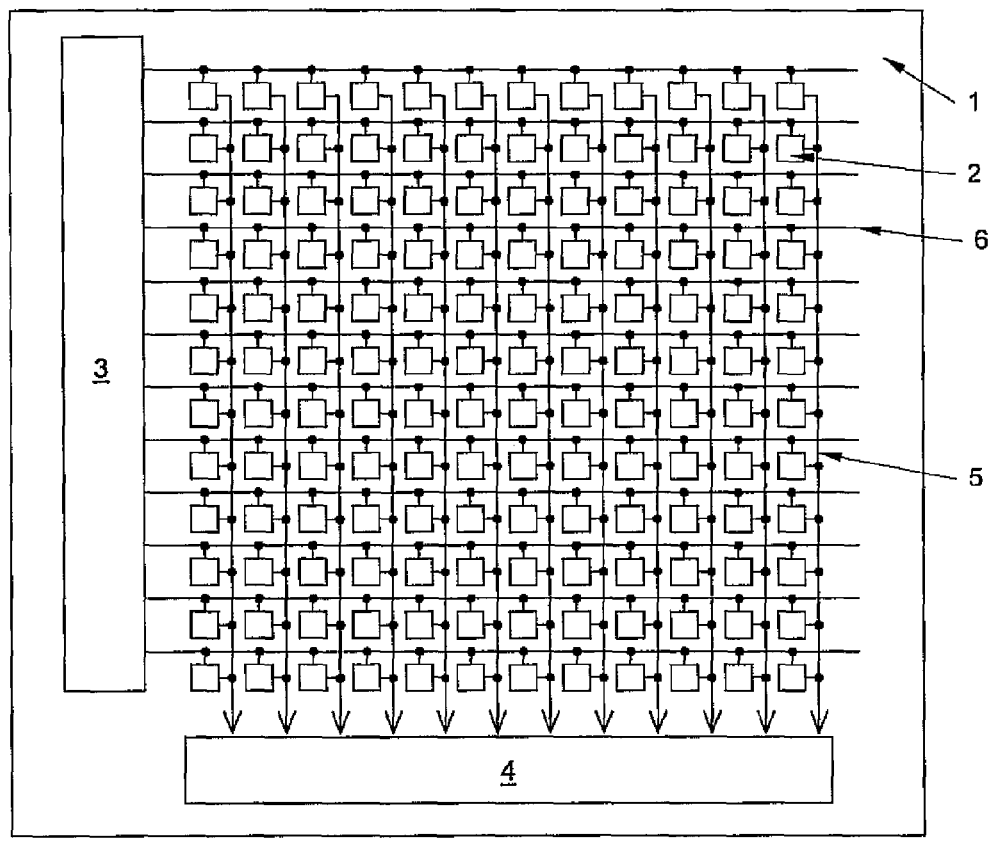
FIG. 1 an image sensor known from the prior art with throughgoing column lines.
Figure 2:
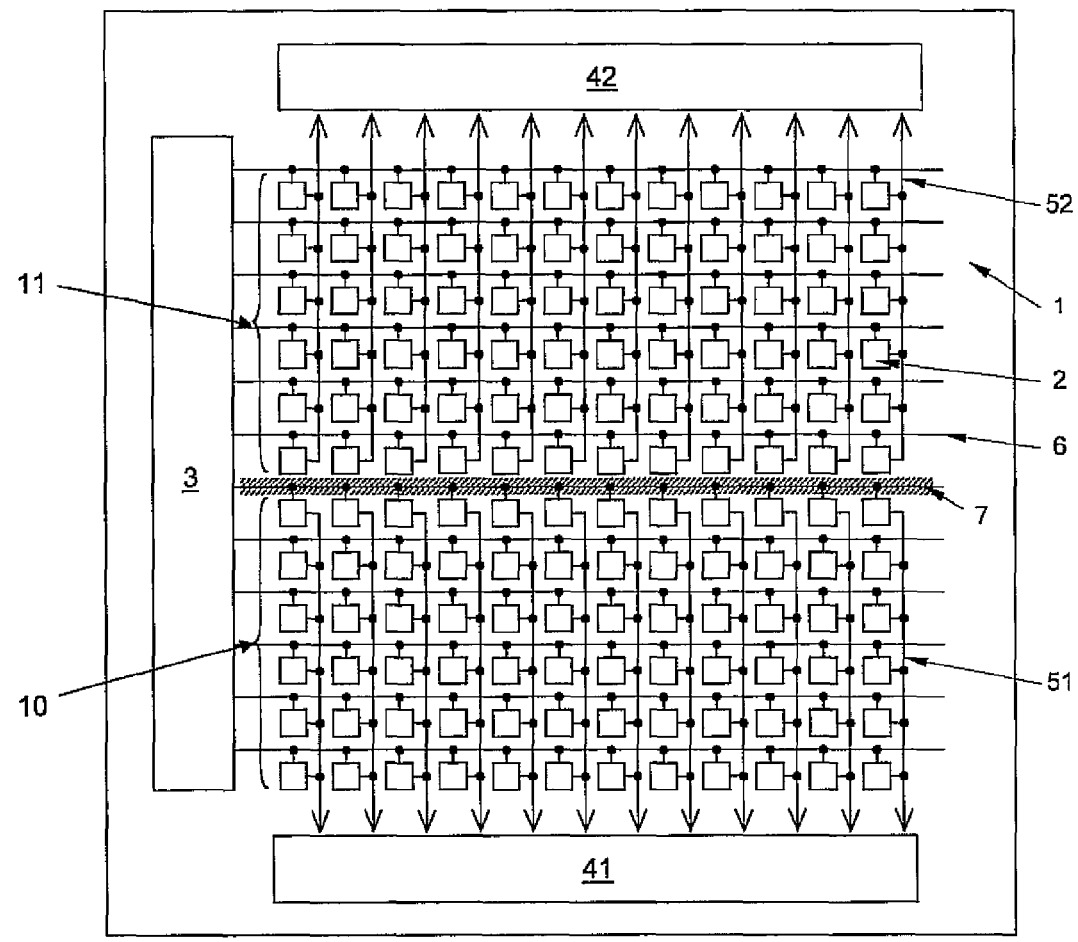
FIG. 2 an image sensor known from the prior art with column lines divided in the middle.

Ultimately, a zigzag dividing line 7 is created by the alternating division of the pixels 2 between those pixels which are associated with the lower pixel groups 21 and those pixels which are associated with the upper pixel groups 22. A straight, horizontal dividing line between a lower pixel block and an upper pixel block, as is known from the image sensor in accordance with FIG. 2, and the interference running through the image center is avoided. The overlap region 8 admittedly has a first and second margin 9 to the pixel rows 10, 11 arranged outside the overlap region 8. However, these margins 9 at the lower end and at the upper end of the overlap region 8 are interrupted at each second column by a lower pixel group 21 or by an upper pixel group 22, i.e. the dividing line 7 only coincides with a respective margin 9 of the overlap region 8 at every second column. This alternative interruption reduces the perceptibility of the margins 9 of the overlap region 8.

In FIG. 3, the two named margins 9 have a spacing of four pixels from one another. This spacing is only exemplary and is especially selected for the 12×12 pixel field shown in FIG. 3. CMOS image sensors for electronic cameras, in particular digital cameras, usually have a much higher number of pixels 2. With an image sensor with, for example, 2000 rows, the aforesaid spacing could amount, for example, to 20 to 30 pixels.

The rows of the overlap region 8 are read out sequentially—i.e. after one another. The rows of the lower block 10 and the rows of the upper block 11, in contrast, can be read out in parallel—i.e. simultaneously pair-wise. With an image sensor with, for example, a total of 2000 rows and 20 overlap region rows thereof, the named 20 rows are read out sequentially; the remaining 1980 rows of the lower and upper blocks are, in contrast, read out in parallel. The time requirement for the reading out therefore only increases slightly from 1000 rows to 1010 rows (990+20 rows) with respect to image sensor 1 in accordance with FIG. 2.

Figure 4:
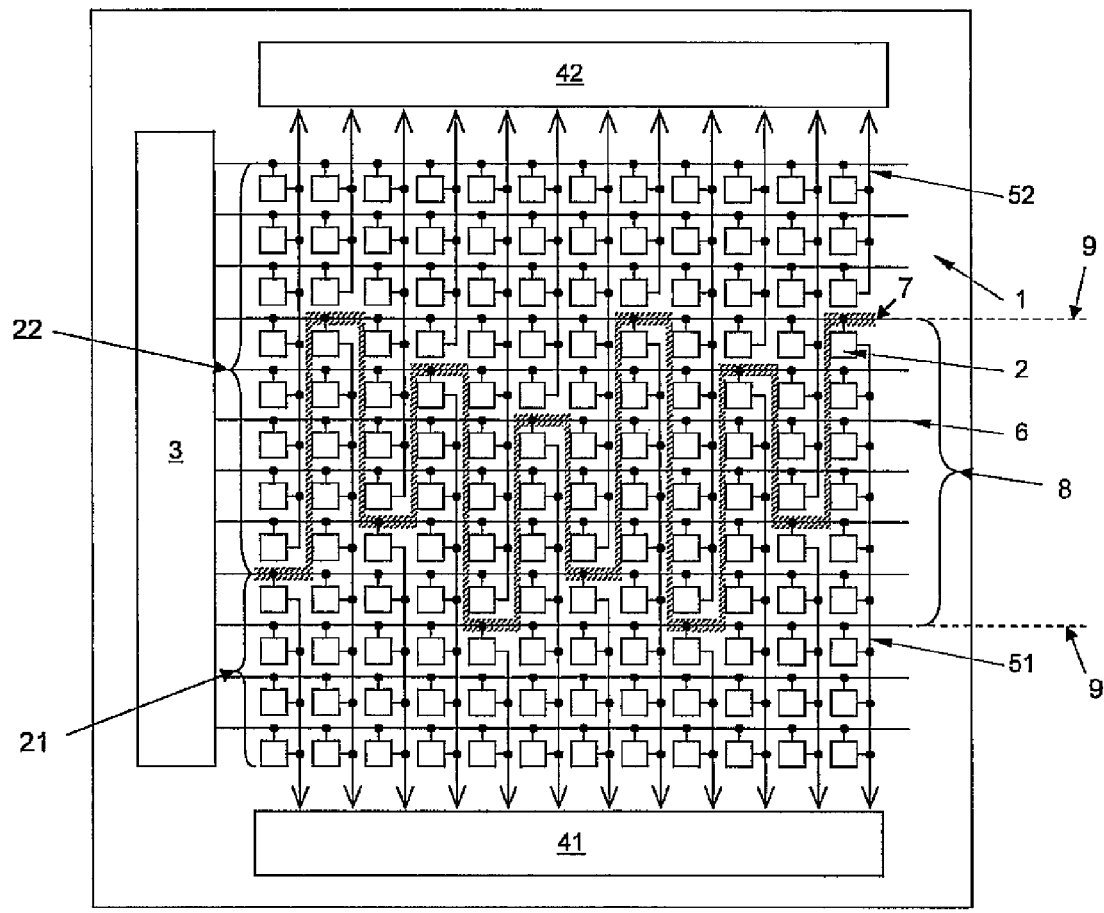
FIG. 4 an image sensor in accordance with the invention in accordance with a second embodiment.

The perceptibility of the lower and upper ends of the overlap region 8—i.e. the margins 9—can be reduced even further if the dividing line 7 between the lower pixel groups 21 and the upper pixel groups 22 does not extend precisely along two straight lines, but the transition between the lower pixel group 21 and the upper pixel group 22 rather deviates for different columns quasi-randomly from such straight lines, as is shown by way of example in the image sensor in accordance with FIG. 4.

To preclude the occurrence of a stripe pattern due to an error between the column amplifiers 41 and the column amplifiers 42, the image sensor 1 according to FIG. 3 or FIG. 4 can be adapted to modify the amplified signals of those pixels 2 of the lower pixel groups 21 which are arranged within the overlap region 8 in dependence on the amplified signals of those pixels 2 of the upper pixel groups 22 which are arranged within the overlap region 8, and vice versa, in order to carry out a mutual brightness compensation.

A 12×12 pixel fields is shown in FIGS. 1 to 4 only for reasons of illustration. A number of the rows and columns of an image sensor used in practice will generally be substantially higher. For example, the image sensors can have a resolution of 3018×2200 pixels.

The invention makes it possible to at least reduce the perceptibility of interference running horizontally through the image center.

The invention claimed is:

1. An image sensor for electronic cameras, having a plurality of light-sensitive pixels (2) arranged in rows and columns, wherein the light-sensitive pixels (2) of a respective column are divided into a first pixel group (21) and a second pixel group (22) according to a permanent division pattern, and wherein, in each column, the light-sensitive pixels (2) of a respective first pixel group (21) are coupled to a common first column amplifier (41) via a common first column line (51) and the light-sensitive pixels of a respective second pixel group (22) are coupled to a common second column amplifier (42) via a common second column line (52), characterized in that the number of the light-sensitive pixels (2) in the first pixel group (21) and the number of light-sensitive pixels in the second pixel group (22) are different for different columns, wherein the permanent division pattern of the light-sensitive pixels (2) into the first pixel group (21) and the second pixel group (22) alternates quasi-randomly between the columns or between groups of adjacent columns.

2. An image sensor in accordance with claim 1, wherein the columns are divided into groups of a plurality of adjacent columns—in particular precisely two adjacent columns, wherein the division of the pixels (2) into the first pixel group (21) and the second pixel group (22) is identical within a respective column group.

3. An image sensor in accordance with claim 1, wherein the division of the pixels (2) into the first pixel group (21) and the second pixel group (22) alternates between the columns or between groups of adjacent columns.

4. An image sensor in accordance with claim 1, wherein rows which include at least one light-sensitive pixel (2) from the first pixel group (21) and at least one light-sensitive pixel (2) from the second pixel group (22) form an overlap region (8) of the image sensor (1).

5. An image sensor in accordance with claim 4, wherein the overlap region (8) is arranged in a central region of the image sensor (1) with respect to the column direction.

6. An image sensor in accordance with claim 4, wherein the image sensor (1) is made to read out in parallel the rows (10) which are arranged outside the overlap region (8) and only include pixels (2) of the first pixel groups (2) and the rows (11) which are arranged outside the overlap region (8) and only include pixels (2) of the second pixel group (22).

7. An image sensor in accordance with claim 4, wherein the image sensor (1) is made to read out sequentially the rows which are arranged within the overlap region (8).

8. An image sensor in accordance with claim 4, wherein the image sensor (1) is made to modify the amplified signals of light-sensitive pixels (2) of the first pixel group (21) which are arranged within the overlap region (8) in dependence on the amplified signals of light-sensitive pixels (2) of the second pixel group (22) which are arranged within the overlap region (8), and to modify the amplified signals of light-sensitive pixels (2) of the second pixel group (22) which are arranged within the overlap region (8) in dependence on the amplified signals of light-sensitive pixels (2) of the first pixel group (21) which are arranged within the overlap region (8), in order to carry out a mutual brightness compensation.

9. An image sensor in accordance with claim 8, wherein the overlap region (8) has a first and a second margin (9) to the rows (10, 11) arranged outside the overlap region (8), and wherein the image sensor (1) is made also to compensate with respect to their brightness the amplified signals of the pixels (2) of the rows (10, 11) which are arranged outside the overlap region (8) and which are located in a respective border region to margins.

10. An image sensor in accordance with claim 9, wherein the image sensor (1) is made to reduce the brightness compensation as the spacing from the margins (9) increases.

11. An image sensor for electronic cameras, having a plurality of light-sensitive pixels (2) arranged in rows and columns, wherein the light-sensitive pixels (2) of a respective column are divided into a first pixel group (21) and a second pixel group (22) according to a permanent division pattern, and wherein, in each column, the light-sensitive pixels (2) of a respective first pixel group (21) are coupled to a common first column amplifier (41) via a common first column line (51) and the light-sensitive pixels of a respective second pixel group (22) are coupled to a common second column amplifier (42) via a common second column line (52), characterized in that the number of the light-sensitive pixels (2) in the first pixel group (21) and the number of light-sensitive pixels in the second pixel group (22) are different for different columns, wherein rows which include at least one light-sensitive pixel (2) from the first pixel group (21) and at least one light-sensitive pixel (2) from the second pixel group (22) form an overlap region (8) of the image sensor (1), and wherein the image sensor (1) is made to modify the amplified signals of light-sensitive pixels (2) of the first pixel group (21) which are arranged within the overlap region (8) in dependence on the amplified signals of light-sensitive pixels (2) of the second pixel group (22) which are arranged within the overlap region (8), and to modify the amplified signals of light-sensitive pixels (2) of the second pixel group (22) which are arranged within the overlap region (8) in dependence on the amplified signals of light-sensitive pixels (2) of the first pixel group (21) which are arranged within the overlap region (8), in order to carry out a mutual brightness compensation, wherein the permanent division pattern of the light-sensitive pixels (2) into the first pixel group (21) and the second pixel group (22) alternates quasi-randomly between the columns or between groups of adjacent columns.

* * * * *